United States Patent [19]

Komatsu et al.

[11] Patent Number: 4,484,212

[45] Date of Patent: Nov. 20, 1984

[54] SEMICONDUCTOR DEVICE

[75] Inventors: Shigeru Komatsu, Yokohama; Michio Nakamura, Kawasaki; Katsuji Fujita, Yokohama, all of Japan

[73] Assignee: Tokyo Shibaura Denki Kabushiki Kaisha, Kawasaki, Japan

[21] Appl. No.: 335,712

[22] Filed: Dec. 29, 1981

[30] Foreign Application Priority Data

Jan. 14, 1981 [JP] Japan .................................. 56-4327

[51] Int. Cl.³ ..................... H01L 29/84; H01L 27/02; H01L 23/48; H01L 29/44
[52] U.S. Cl. ......................................... 357/51; 357/26; 357/68; 338/13; 73/DIG. 4
[58] Field of Search ................. 357/51, 26, 68; 338/2, 338/3, 5, 13; 73/DIG. 4

[56] References Cited

U.S. PATENT DOCUMENTS

| | | | |
|---|---|---|---|
| 4,215,333 | 7/1980 | Huang | 357/68 |
| 4,398,207 | 8/1983 | Hoff, Jr. et al. | 357/51 |

FOREIGN PATENT DOCUMENTS

| | | | |
|---|---|---|---|
| 35361 | 9/1981 | European Pat. Off. | 357/51 |
| 53-984 | 6/1976 | Japan. | |
| 1520929 | 8/1978 | United Kingdom. | |

Primary Examiner—Martin H. Edlow
Assistant Examiner—Jerome Jackson, Jr.
Attorney, Agent, or Firm—Finnegan, Henderson, Farabow, Garrett & Dunner

[57] ABSTRACT

A semiconductor device comprising a semiconductor substrate having at least two resistor elements, wherein said resistor elements have a specific resistance ratio relative to each other, an insulation layer formed on a major surface of said semiconductor substrate, a circuit wiring layer formed on said insulation layer covering a portion of said insulation layer which corresponds to at least one of said resistor elements, and a dummy wiring layer made of the same material as that of the circuit wiring layer and formed on the insulation layer covering that portion of said insulation layer which corresponds to the resistor element or elements not covered by said circuit wiring layer, and where the ratio of an overlapping area of one resistor element in said circuit wiring layer and an overlapping area of the other resistor element and said dummy wiring layer is equal to a resistance ratio of said resistor elements.

18 Claims, 10 Drawing Figures

F I G. 9
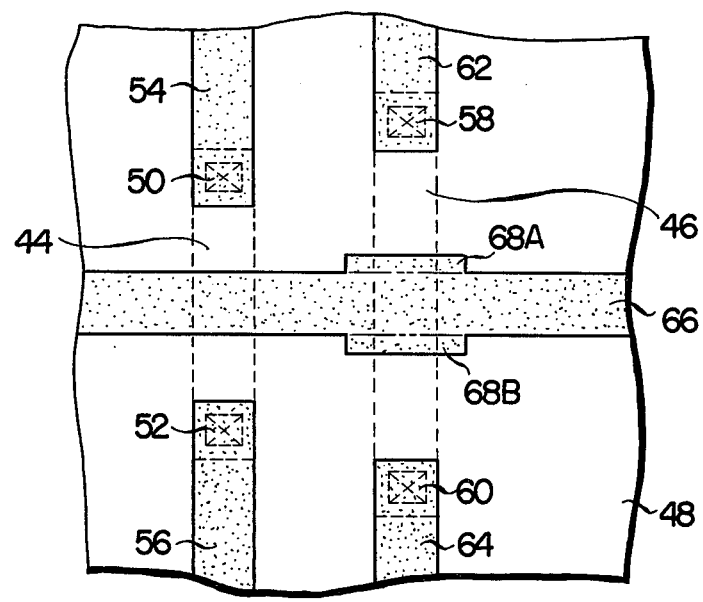
F I G. 10
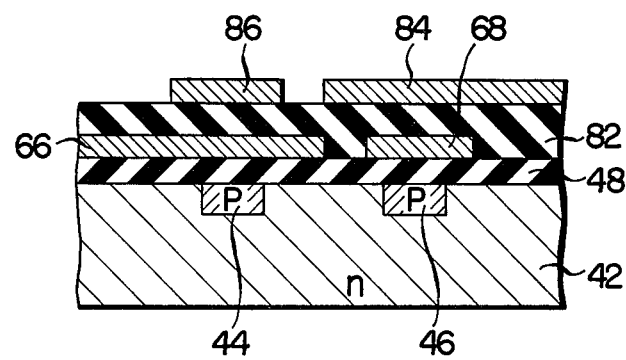

SEMICONDUCTOR DEVICE

BACKGROUND OF THE INVENTION

The present invention relates to a semiconductor device and more particularly to a semiconductor device with a specific resistance ratio between or among resistor elements formed on a semiconductor substrate.

A conventional semiconductor device is comprised of a semiconductor substrate (including a number of elements such as transistors, diodes, diffused resistors, and the like), and an insulation layer (referred to as a circuit wiring layer) for electrically wiring the elements. The circuit wiring layer is formed on the substrate in a given pattern of an insulating layer having contact holes formed at given locations. Contained in a number of the resistor elements formed on the substrate are two or more resistor elements requiring relative characteristics providing or satisfying a resistance ratio between or among the resistors. In order to obtain the relative characteristics required, the resistor elements of such type generally are located closely to one another, are about the same size, and extend in the same direction.

Even if those elements are thus formed, however, when circuit wiring layers cross a location on the insulation film on the substrate corresponding to the location of where the resistor elements are formed, stresses applied to the resistor element change. As a result, the relative characteristics of such resistor elements can not be kept.

A conventional semiconductor device with such a structure will be described referring to FIG. 1 through 3. Two P conductivity type resistor regions 14 and 16 constituting resistor elements are formed in an N conductivity substrate 12. Resistor elements 14 and 16 are disposed close to and in parallel with each other and are about the same size, in order to obtain a relative characteristic satisfying a resistance ratio 1:1 between these elements. The resistor element 14 is connected at both ends to circuit wiring layers 18 and 20. The resistor element 16 is also connected at both ends to circuit wires 22 and 24. An insulation layer 26 is formed on the substrate 12 except at the contact portions of the circuit wiring layers and the resistive elements. Another circuit wiring layer 28 for wiring other elements not shown is formed on the insulation substrate 26. The wiring layer 28 passes only resistor element 14, not the resistor element 16.

In a semiconductor device with such a structure, since the wiring layer 28 is partially formed at the location on the insulation layer 26 corresponding to the resistor element 14, the wiring layer 28 stresses the resistor element 14 to change the resistance of the resistor element 14. Therefore, the required relative characteristics of the resistor elements 14 and 16 can not be obtained even if the resistor elements 14 and 16 are formed in the close, parallel, and same size manner, as mentioned above. The phenomenon that the resistance of the resistor element formed in the semiconductor substrate changes when it is subjected to a stress is called a piezo-resistance effect. As the result of the piezo-resistive effect, the resistance of a P conductivity type resistor element formed on the (1 1 1) of a silicon substrate decreases. The resistance of the resistor element on the (1 0 0) surface exhibits a crystal-axis-dependent characteristic and changes dependent on the crystal axis.

Pure aluminum has been used for the circuit wiring layer. Recently, however, corrosion-resistive alloy such as Al-Si-Cu, Al-Si, and Al-Ti, poly silicon, or metal silicide have gradually been used. The circuit wiring layer made of such material applies to the substrate a larger stress than the circuit wiring layer made of the pure aluminum. Accordingly, in the conventional semiconductor device shown in FIGS. 1 to 3, when the circuit wiring layer 28 is made of the material as mentioned above, the piezo-resistance effect occuring in the resistor element 14 is greater, so that the relative characteristics of the resistor elements 14 and 16 are different from each other.

SUMMARY OF THE INVENTION

Accordingly, an object of the present invention is to provide a highly reliable semiconductor device having a plurality of resistor elements requiring the relative characteristics in which the relative characteristics are not damaged when the resistor elements are subjected to stresses selectively applied by the circuit wiring layer. According to the invention, there is provided a semiconductor device comprising a semiconductor substrate having at least two resistor elements wherein said resistor elements have a specific resistance ratio relative to each other, an insulation layer formed on a major surface of the semiconductor substrate, a circuit wiring layer formed on the insulation layer and covering a portion of the insulation layer which corresponds to at least one of the resistor elements, and a dummy wiring layer formed on the insulation layer and covering that portion of the insulation layer which corresponds to the resistor element or elements not covered by the circuit wiring layer, and wherein the circuit wiring layer causes less stress on the resistance element not covered by the circuit wiring layer than on the resistance element covered by the circuit wiring layer.

BRIEF DESCRIPTION OF THE DRAWINGS

FIGS. 7, 8 and 9 are plan views of other embodiments of a semiconductor device according to the present invention; and FIG. 10 is a cross sectional view of a further embodiment of a semiconductor device according to the present invention.

DETAILED DESCRIPTION OF THE PREFERRED EMBODIMENTS

A first embodiment of a semiconductor device according to the present invention will be described referring to FIGS. 4 to 6.

Figure 4:
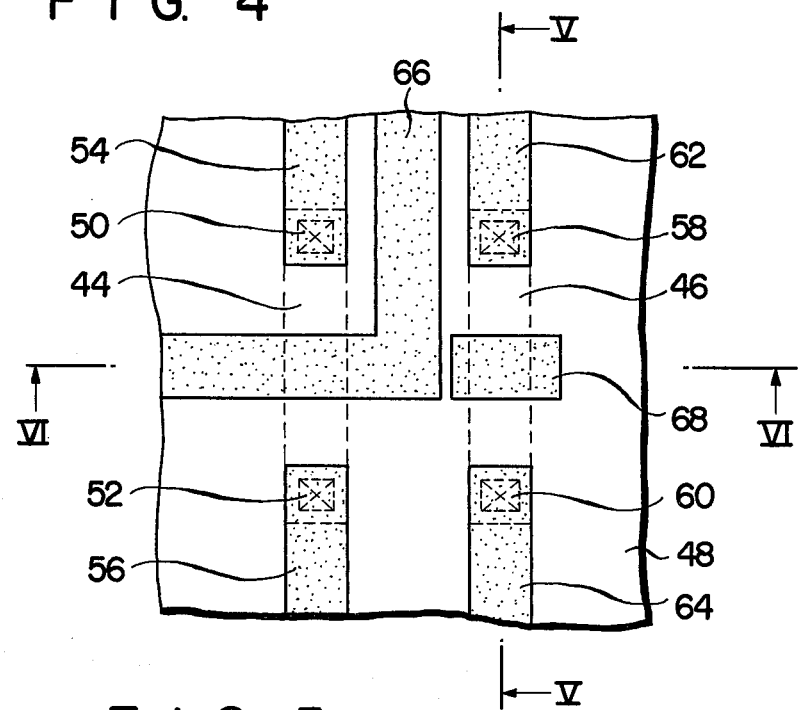
FIG. 4 is a plan view of an embodiment of a semiconductor device including a couple of resistor elements requiring the relative characteristics.
Figure 5:
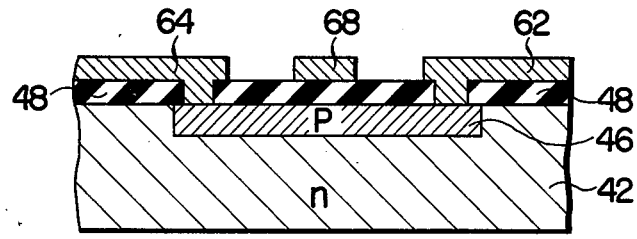
FIG. 5 is a cross sectional view taken on line II—II in FIG. 4 and viewed in the direction of arrows.
Figure 6:
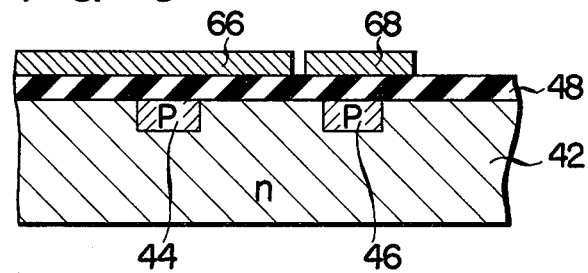
FIG. 6 is a cross sectional view taken in the direction of arrows along line VI—VI in FIG. 4.

In a semiconductor device shown in FIGS. 4 to 6, a couple of P conductivity type regions 44 and 46, prepared by an impurity diffusion technique, for example, are provided in an N conductivity substrate 42. The P regions 44 and 46 serve as resistor elements, respectively. To secure specific relative characteristics providing a resistance ratio of 1:1 between the resistor elements 44 and 46, those resistors formed are disposed closely and in parallel, and are about the same in size and configuration. An insulation layer 48, made of silicon oxide film, for example, with a given pattern having contact holes for various types of elements containing the resistor elements 44 and 46 (in the drawing, the holes only for the resistor elements 44 and 46 are depicted for simplicity), is formed on the main surface of the substrate 42. The resistor element 44 is made to ohmic-contact at both ends with circuit wiring layers 54 and 56 formed on the insulating layer 48, through the contact holes 50 and 52. The resistor element 46 is likewise made to ohmic-contact at both ends with circuit wiring layers 62 and 64 formed on the insulation layer 48, through the contact holes 58 and 60. An additional circuit wiring layer 66 for interconnecting other semiconductor elements not shown is formed on the insulation layer 48. The circuit wiring layer 66 passes a location on the insulation layer 48 corresponding to the resistor element 44, as one of the resistor elements 44 and 46 requiring the relative characteristics. Another wiring layer 68, passing a location corresponding to the other resistor element 46, is further formed on the insulation layer 48. The wiring layer 68 is not used for interconnecting the elements and is merely for keeping the relative characteristics of the elements 44 and 46 to provide the resistance ratio 1:1. In this respect, the wiring layer 18 will be referred to as a dummy wiring layer. For keeping the relative characteristics satisfying the resistance ratio 1:1, a ratio of an overlaping area of the dummy wiring layer 68 and the resistor element 46 and an overlapping area of the circuit wiring layer 66 and the resistor element 44 is set at 1:1, which is equal to the resistance ratio 1:1. In order to equalize the stress caused by the wiring layer per unit area, the layers 68 and 66 are made of the same material.

In the semiconductor device with such a structure, the resistor element is stressed by the circuit wiring layer 66 and the resistor element 46 is also stressed by the dummy wiring layer 68. Since the two overlapping areas are equal to each other, and the circuit wiring layer 66 and dummy wiring layer 68 are made of the same material, the stresses applied to the two resistor elements 44 and 46 are substantially equal to each other, that is, 1:1 equal to the resistance ratio 1:1. As a result, substantially the same resistance effects are produced in the resistor elements 44 and 46. Therefore, the relative characteristics of the resistor elements 44 and 46 are kept are 1:1, corresponding to the resistance ratio 1:1. Therefore, reliable and highperformance devices are provided.

Figure 1:
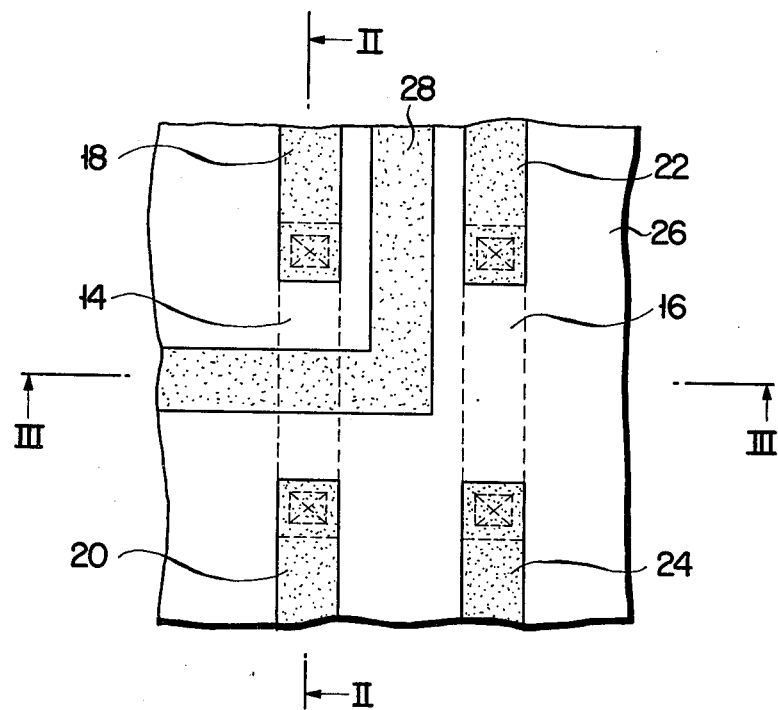
FIG. 1 is a plan view of a conventional semiconductor device containing a couple of semiconductor resistor elements requiring relative characteristics.
Figure 2:
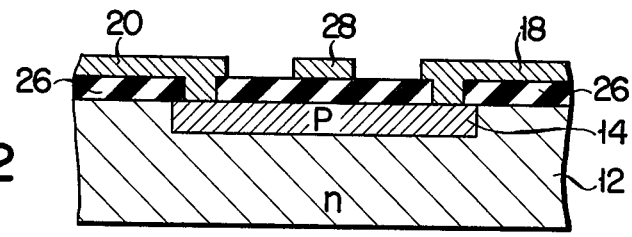
FIG. 2 is a cross sectional view taken on line II—II in FIG. 1, and viewed in the direction of arrows.
Figure 3:
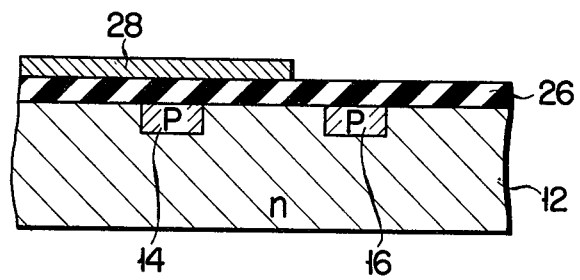
FIG. 3 is a cross sectional view taken on line III—III in FIG. 1 and viewed in the direction of arrows.

A variation among the relative characteristics is reduced to half compared to the conventional semiconductor devices shown in FIGS. 1 to 3. This fact was confirmed by an experiment conducted by the inventor. The present invention is particularly effective when it is applied to a case where a large stress is applied to the resistor element 44. For example, the overlapping areas of the resistor element 44 and the circuit wiring layer 66 are large or the circuit wiring layer 66 is made of material giving a high stress such as the corrosion resistive alloy, for example, Al - Si - Cu, Al - Ti, and the like, or metal silicide.

Figure 7:
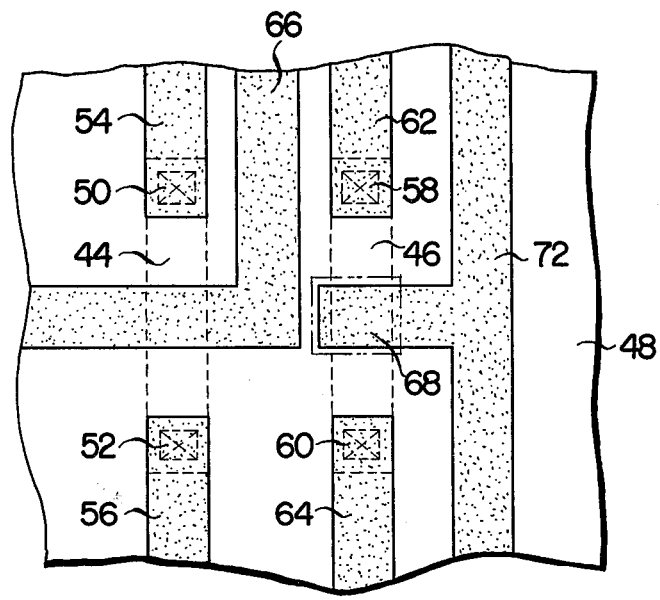

FIG. 7 shows another embodiment of a semiconductor device according to the present invention. In the present embodiment, the dummy wiring layer 68 is formed as an extension which extends from a circuit wiring layer 72 formed close to the resistor element 46 and passes a location corresponding to the resistor element 46. The circuit wiring layer 72 interconnects elements not shown. The extension 68 is not used to interconnect any elements but serves as a dummy wiring layer for setting the relative characteristics of the two resistive elements so as to have the resistance ratio 1:1. The remaining structure of the present embodiment are substantially the same as that of FIGS. 4 to 6. Therefore, no further explanation is given with the like reference numerals being applied to the like portions in FIGS. 4 to 6.

Figure 8:
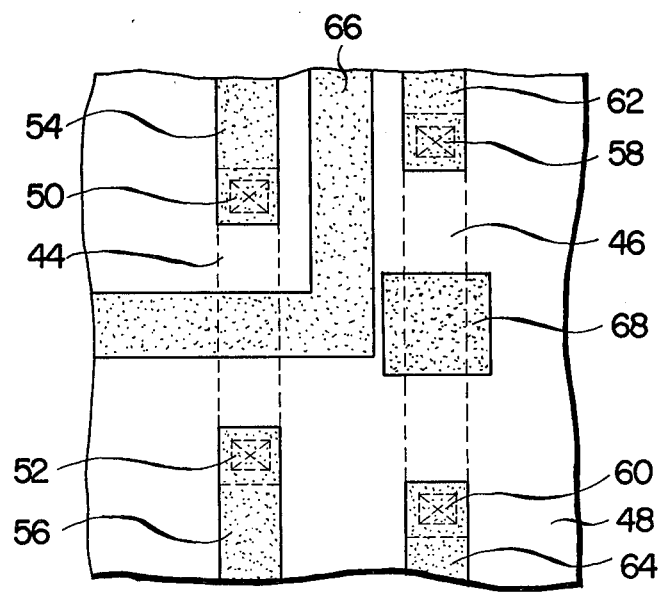

FIG. 8 shows another embodiment of a semiconductor device according to the present invention. In the present embodiment, the resistance ratio of resistor elements 44 and 46 is 1:1.5, while that of the first embodiment shown in FIGS. 1 to 6 is 1:1. To realize the relative characteristics of the resistance elements providing the resistance ratio 1:1.5, the length of the dummy wiring layer 68, as viewed in an extending direction of the resistor element 46, is 1.5 times the width of the circuit wiring layer 66. Accordingly, the ratio of the overlapping area of the resistor elements 44 and the circuit wiring layer 66 and the overlapping area of the resistor element 46 and the dummy wiring area 68 is 1:1.5, and equal to the resistance ratio 1:1.5. With this arrangement, a ratio of the stress applied by the dummy wiring layer 68 to the resistor element 44 and that applied by the dummy wiring layer 68 to the resistor element 46 is 1:1.5 which is equal to the resistance ratio 1:1.5. Accordingly, the relative characteristics of the resistor elements provide the resistance ratio 1:1.5.

FIG. 9 illustrates yet another embodiment of a semiconductor device according to the present invention.

In the present embodiment, a resistance ratio of the resistor elements 44 and 46 is 1:1.5. The circuit wiring layer 66 passes not only a location on the insulation layer 46 corresponding to the resistor element 44 but also a location on the substrate layer corresponding to the resistor element 46. In order to make the overlapping area of the resistor element 44 and the circuit wiring layer 66 and the overlapping area of the resistor element 46 and the circuit wiring layer 66 equal to the resistance ratio 1:1.5, the overlapping area of the circuit wiring layer 66 with the resistor element 46 is enlarged by expanded portions 68A and 68B on both sides of the circuit wiring layer 66. These expanded portions 68A and 68B serve as dummy wiring layers. The width of the portion of the wiring layer containing the expanded portions 68A and 68B is 1.5 times that of the remaining portion of the wiring layer 66. With this configuration, a ratio of the overlapping areas of the resistor element 44 and the circuit wiring layer 66 and the overlapping area of the resistor element 46 and the overlapping area of the circuit wiring layer 66 including the dummy circuit layers 68A and 68B is equal to the resistance ratio 1:1.5. Accordingly, the ratio of the stresses applied to the resistor elements 44 and 46 is 1:1.5 to keep the relative characteristics providing the resistance ratio 1:1.5.

While in the four embodiments as mentioned above, the present invention is applied to the semiconductor device of the single wiring layer type, the present invention is applicable for the multilayer type semiconductor device.

An example when the present invention is applied for a semiconductor device of the multilayer type is illustrated in FIG. 10.

The embodiment shown in FIG. 10 corresponds to that of FIG. 6. In the figure, like numerals are used for designating like portions in FIG. 6.

In the embodiment of FIG. 10, an insulation layer 82 is formed on the major surface of the structure containing the circuit wiring layer 66 and the dummy wiring layer 68. A circuit wiring layer 84 passes the location on the insulation layer 82 corresponding to the resistor element 46. A dummy wiring layer 86 made of the same material as that of the circuit wiring layer 84 is formed at the location of the insulation layer 66 corresponding to the circuit wiring layer 84. The circuit wiring layer 84 interconnects the elements not shown. As in the case of the first embodiment described referring to FIGS. 3 to 6, in order to obtain the resistance ratio 1:1, a ratio of the overlapping area of the circuit receiving element and the resistor element 46 and the overlapping area of the dummy wiring element 86 and the resistor element 44 is set at 1:1 which is equal to the resistance ratio 1:1.

Also in the semiconductor device of the multilayer type, the stress applied by the circuit wiring layer 84 to the resistor element 46 is substantially the same as that by the dummy wiring layer to the resistor element 44. The piezo-resistances produced in the resistor elements 44 and 46 are substantially equal to each other. Therefore, the relative characteristics of the resistor elements 44 and 46 can be kept so as to provide the resistance ratio 1:1.

In the appended claims, a "conductivity wiring layer" will be used for generally expressing the circuit wiring layer 66 or 84 and the dummy wiring layer 68 or 86.

The P conductivity type material may be course be used for the substrate which is made of the N conductivity type material in the above-mentioned embodiments. When the P conductivity material is used for the substrate, the region of the resistor elements must be of the N conductivity type.

It should be understood that the present invention may be modified variously within the scope of the present invention.

What we claim is:

1. A semiconductor device comprising:
a semiconductor substrate having at least two resistor elements formed therein, wherein said resistor elements formed therein have a specific resistance ratio relative to each other;
an insulation layer formed on a major surface of said semiconductor substrate;
a circuit wiring layer formed on said insulation layer, covering a portion of said insulation layer which corresponds to at least one of said resistor elements; and
a dummy wiring layer formed on said insulation layer, covering that portion of said insulation layer which corresponds to the resistor element or elements not covered by said circuit wiring layer, and wherein said circuit wiring layer causes less stress on said resistance element not covered by said circuit wiring layer than on said resistance element covered by said circuit wiring layer, said resistance ratio of said resistance elements formed therein being stress-dependent.

2. A semiconductor device according to claim 1, wherein said circuit wiring layer covers a portion of said insulation layer which corresponds to one of said two resistor elements; and
said dummy wiring layer covers a portion of said insulation layer which corresponds to the other of said two resistor elements not covered by said circuit wiring layer.

3. A semiconductor device according to claim 2, wherein a ratio of an overlapping area of said resistor element and said circuit wiring layer and an overlapping area of said other resistor element and said dummy wiring layer is equal to a ratio of a resistance value of said one resistor element and that of said other resistor element.

4. A semiconductor device according to claim 1, wherein a ratio of an overlapping area of said resistor element covered by said dummy wiring layer and said dummy wiring layer and an overlapping area of said resistor element covered by said circuit wiring layer and said circuit wiring layer is equal to a ratio of a resistance value of said resistor element covered by said dummy wiring layer and said resistance value of said resistor element covered by said circuit wiring layer.

5. A semiconductor device according to claims 1, 2, 3 or 4, wherein said circuit wiring layer and said dummy wiring layer are made of the same material.

6. A semiconductor device according to claim 5, wherein said material is corrosion resistive alloy.

7. A semiconductor device according to claim 5, wherein said material is a poly crystal silicon.

8. A semiconductor device according to claim 5, wherein said material is metal silicide.

9. A semiconductor device according to claim 6, wherein said corrosion resistive alloy is one selected from Al - Si - Cu, Al - Si and Al - Ti.

10. A semiconductor device of the multilayer type comprising:
a semiconductor substrate having at least two resistor elements formed therein, wherein said resistor elements formed therein have a specific resistance ratio relative to each other;
a multi-layer arrangement of insulation layer-conductive wiring layer in which insulation layers and conductive wiring layers are alternately superimposed in this order on a major surface of said semiconductor substrate;
said conductive wiring layer including a circuit wiring layer and a dummy wiring layer;
said circuit wiring layer being formed to cover one of said two resistor elements on the lower side of said insulation layer; and
said dummy wiring layer being formed to cover said resistor element not covered by said circuit wiring layer and wherein said circuit wiring layer causes less stress on said resistance element not covered by said circuit wiring layer than on said resistance element covered by said circuit wiring layer, said resistance ratio of said resistance elements formed therein being stress-dependent.

11. A semiconductor device according to claim 10, wherein said circuit wiring layer covers a portion of said insulation layer which corresponds to one of said two resistor elements; and
said dummy wiring layer covers a portion of said insulation layer which corresponds to the other of said two resistor elements not covered by said circuit wiring layer.

12. A semiconductor device according to claim 11, wherein a ratio of an overlapping area of said one resistor element and said circuit wiring layer and an overlapping area of said other resistor element and said dummy wiring layer is equal to a ratio of a resistance value of said one resistor element and that of said other resistor element.

13. A semiconductor device according to claim 10, wherein a ratio of an overlapping area of said resistor element covered by said dummy wiring layer and said dummy wiring layer and an overlapping area of said resistor element covered by said circuit wiring layer and said circuit wiring layer is equal to a ratio of a resistance value of said resistor element covered by said dummy wiring layer and said resistance value of said resistor element covered by said circuit wiring layer.

14. A semiconductor device according to claims 10, 11, 12 or 13, wherein said circuit wiring layer and said dummy wiring layer are made of the same material.

15. A semiconductor device according to claim 14, wherein said material is corrosion resistive alloy.

16. A semiconductor device according to claim 14, wherein said material is a poly crystal silicon.

17. A semiconductor device according to claim 14, wherein said material is metal silicide.

18. A semiconductor device according to claim 15, wherein said corrosion resistive alloy is one selected from Al - Si - Cu, Al - Si and Al - Ti.

* * * * *